US012581698B2

(12) United States Patent
Huang et al.

(10) Patent No.: US 12,581,698 B2
(45) Date of Patent: Mar. 17, 2026

(54) LATERALLY DIFFUSED METAL OXIDE SEMICONDUCTOR DEVICE AND PREPARATION METHOD THEREOF

(71) Applicant: CANSEMI TECHNOLOGY INC., Guangzhou (CN)

(72) Inventors: Haiyan Huang, Guangzhou (CN); Rilin Zhang, Guangzhou (CN)

(73) Assignee: CANSEMI TECHNOLOGY INC., Guangzhou (CN)

( * ) Notice: Subject to any disclaimer, the term of this patent is extended or adjusted under 35 U.S.C. 154(b) by 0 days.

(21) Appl. No.: 19/175,411

(22) Filed: Apr. 10, 2025

(65) Prior Publication Data

US 2025/0366081 A1     Nov. 27, 2025

Related U.S. Application Data

(63) Continuation of application No. PCT/CN2024/136114, filed on Dec. 2, 2024.

(30) Foreign Application Priority Data

May 21, 2024     (CN) .......................... 202410627191.8

(51) Int. Cl.
H10D 62/00          (2025.01)
H10D 30/01          (2025.01)
(Continued)

(52) U.S. Cl.
CPC ....... H10D 62/054 (2025.01); H10D 30/0281 (2025.01); H10D 30/65 (2025.01);
(Continued)

(58) Field of Classification Search
CPC .. H10D 30/0281; H10D 30/65; H10D 62/054; H10D 62/109; H10D 64/111; H10D 84/0126; H10D 84/835
(Continued)

(56) References Cited

U.S. PATENT DOCUMENTS

2002/0079521 A1     6/2002   Lin
2010/0001343 A1     1/2010   Choi et al.
(Continued)

FOREIGN PATENT DOCUMENTS

CN          103022140 A       4/2013
CN          113270500 A       8/2021
(Continued)

*Primary Examiner* — Fazli Erdem
(74) *Attorney, Agent, or Firm* — MUNCY, GEISSLER, OLDS & LOWE, P.C.

(57)          ABSTRACT

The present disclosure provides an LDMOS device and a preparation method thereof, including: providing a substrate including a first drift region of a first conductivity type and a body region of a second conductivity type; forming a first gate structure and a first blocking structure, where the first gate structure is formed above a portion of the body region and a portion of the first drift region, the body region and the first drift region respectively include first and second regions not covered by the first gate structure, and the first blocking structure is formed above the second region; performing an ion implantation process, where a part of ions are implanted into the first region of the body region to form a body region contact region, and a part of ions are implanted into the second region after passing through the first blocking structure to form a first doped region.

10 Claims, 8 Drawing Sheets

(51) Int. Cl.

| | | |
|---|---|---|
| *H10D 30/65* | (2025.01) | |
| *H10D 62/10* | (2025.01) | |
| *H10D 64/00* | (2025.01) | |
| *H10D 84/01* | (2025.01) | |
| *H10D 84/83* | (2025.01) | |

(52) U.S. Cl.
CPC ......... *H10D 62/109* (2025.01); *H10D 64/111* (2025.01); *H10D 84/0126* (2025.01); *H10D 84/835* (2025.01)

(58) Field of Classification Search
USPC ........................................................ 257/339
See application file for complete search history.

(56)                          References Cited

U.S. PATENT DOCUMENTS

| | | | |
|---|---|---|---|
| 2017/0062608 A1* | 3/2017 | Mori ................... | H10D 64/111 |
| 2022/0059662 A1 | 2/2022 | Chung et al. | |
| 2023/0343869 A1* | 10/2023 | Xu ........................ | H10D 30/65 |

FOREIGN PATENT DOCUMENTS

| | | |
|---|---|---|
| CN | 114267722 A | 4/2022 |
| CN | 115547838 A | 12/2022 |
| CN | 116454135 A | 7/2023 |
| CN | 118248554 A | 6/2024 |

* cited by examiner

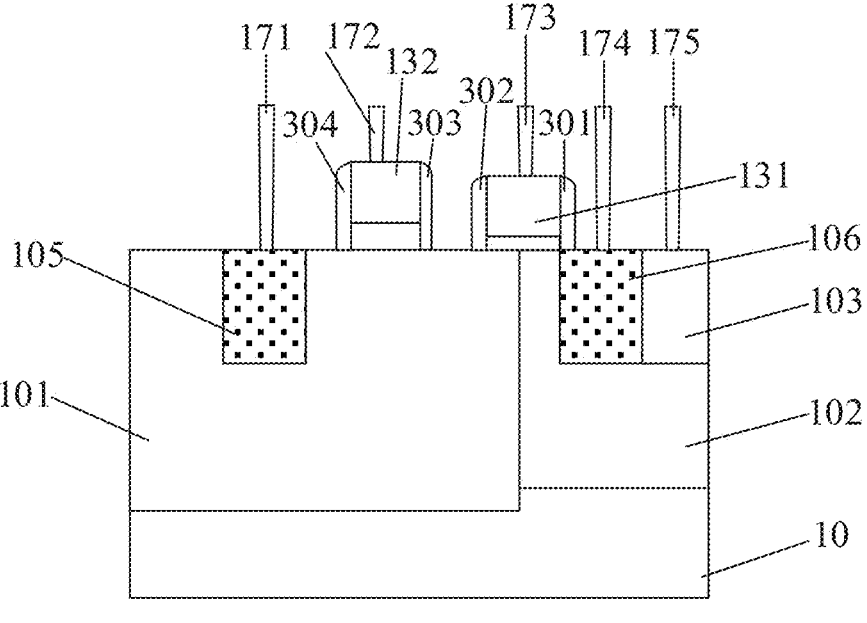

FIG. 1

Providing a substrate, where the substrate includes a first drift region of a first conductivity type and a body region of a second conductivity type — S101

Forming a first gate structure and a first blocking structure, where the first gate structure is formed above a portion of the body region and a portion of the first drift region, the body region also includes a first region not covered by the first gate structure, the first drift region also includes a second region not covered by the first gate structure, and the first blocking structure is formed above the second region of the first drift region — S102

Performing an ion implantation process, where a part of ions are implanted into the first region of the body region to form a body region contact region of the second conductivity type, and a part of ions are implanted into the second region of the first drift region after passing through the first blocking structure to form a first doped region of the second conductivity type — S103

FIG. 2

LATERALLY DIFFUSED METAL OXIDE SEMICONDUCTOR DEVICE AND PREPARATION METHOD THEREOF

RELATED APPLICATIONS

This application is a Continuation Application of International Application No. PCT/CN2024/136114, filed on Dec. 2, 2024, which claims priority to Chinese patent application No. 202410627191.8, filed on May 21, 2024, entitled "LATERALLY DIFFUSED METAL OXIDE SEMICONDUCTOR DEVICE AND PREPARATION METHOD THEREOF", which is incorporated herein by reference in its entirety.

TECHNICAL FIELD

The present disclosure relates to the field of semiconductor technology, and in particular, to a laterally diffused metal oxide semiconductor device and a preparation method thereof.

BACKGROUND

BCD (BJT-CMOS-DMOS) process technology is an important power integrated circuit manufacturing technology, which can integrate three different manufacturing technologies on a same chip. Specifically, it integrates high-voltage power transistors such as a bipolar junction transistor (BJT) for high-precision processing of an analog signal, a complementary metal oxide semiconductor transistor (CMOS) for designing a digital control circuit, and a double-diffused metal oxide semiconductor transistor (DMOS) for developing a power supply and a high-voltage switching device, as well as various electronic elements such as a resistor, a capacitor, and a diode on the same chip. Therefore, it combines the advantages of high transconductance and strong load driving capability of BJT and high integration and low power consumption of CMOS and can realize the combinations of a high-speed device and a low-power device, and a high-voltage device and a low-voltage device. Since a laterally diffused metal oxide semiconductor (LDMOS) device in DMOS is more compatible with CMOS process, the high-voltage LDMOS device is often used in a high-voltage power integrated circuit to meet the requirement of high withstand voltage and power control.

The high voltage and high current characteristics of the power integrated circuit often require a high voltage device to have high breakdown voltage (BV) and low specific on-resistance (Ron, sp). How to increase the breakdown voltage and maintain a low specific on-resistance of the LDMOS device has always been a key research direction in the industry.

SUMMARY

In view of this, an embodiment of the present disclosure provides a laterally diffused metal oxide semiconductor device and a preparation method thereof to solve at least one problem existing in the background.

In a first aspect, an embodiment of the present disclosure provides a method for preparing a laterally diffused metal oxide semiconductor device, and the method includes: providing a substrate, where the substrate includes a first drift region of a first conductivity type and a body region of a second conductivity type; forming a first gate structure and a first blocking structure, where the first gate structure is formed above a portion of the body region and a portion of the first drift region, the body region also includes a first region not covered by the first gate structure, the first drift region also includes a second region not covered by the first gate structure, and the first blocking structure is formed above the second region of the first drift region; performing an ion implantation process, where a part of the ions are implanted into the first region of the body region to form a body region contact region of the second conductivity type, and a part of the ions are implanted into the second region of the first drift region after passing through the first blocking structure to form a first doped region of the second conductivity type.

Combining with the first aspect of the present disclosure, in an optional implementation, the first blocking structure includes a first field plate structure, and the performing an ion implantation process includes: forming a first mask layer, where the first mask layer exposes a surface of the first field plate structure and a surface of the first region; performing the ion implantation process using the first mask layer as a mask to form the first doped region and the body region contact region.

Combining with the first aspect of the present disclosure, in an optional implementation, the method also includes forming a first field plate structure above the first drift region. The first blocking structure includes a spacer structure. The spacer structure is located between the first field plate structure and the first gate structure and extends from a sidewall of the first field plate structure to a sidewall of the first gate structure. The performing an ion implantation process includes: forming a second mask layer, where the second mask layer exposes a surface of the spacer structure and a surface of the first region; performing the ion implantation process using the second mask layer as a mask to form the first doped region and the body region contact region.

Combining with the first aspect of the present disclosure, in an optional implementation, a doping concentration of the first doped region is lower than a doping concentration of the first drift region.

Combining with the first aspect of the present disclosure, in an optional embodiment, the substrate also includes a second drift region, and the second drift region and the first drift region are respectively located on two sides of the body region. The method also includes: forming a second gate structure and a second blocking structure, where the second gate structure is formed above a portion of the body region and a portion of the second drift region, the second drift region also includes a third region not covered by the second gate structure, the second blocking structure is formed above the third region of the second drift region, and the second blocking structure is located on a side of the second gate structure away from the first gate structure. During the performing an ion implantation process, a part of ions are implanted into the third region of the second drift region after passing through the second blocking structure to form a second doped region of the second conductivity type.

In a second aspect, an embodiment of the present disclosure provides a laterally diffused metal oxide semiconductor device, and the laterally diffused metal oxide semiconductor device is prepared by the method for preparing a laterally diffused metal oxide semiconductor device according to any one of the first aspect.

In a third aspect, an embodiment of the present disclosure provides another laterally diffused metal oxide semiconductor device, and the laterally diffused metal oxide semiconductor device includes: a substrate; a first drift region of a first conductivity type and a body region of a second conductivity type respectively located in the substrate; a first gate structure located above a portion of the body region and a portion of the first drift region, where the body region also includes a first region not covered by the first gate structure, and the first drift region also includes a second region not covered by the first gate structure; a first blocking structure located above the second region of the first drift region; a body region contact region of the second conductivity type located in the first region of the body region; a first doped region of the second conductivity type located in the second region of the first drift region, and a doping concentration of the first doped region is lower than a doping concentration of the first drift region.

Combining with the third aspect of the present disclosure, in an optional implementation, the first blocking structure includes a first field plate structure. The first doped region is located in the second region below the first field plate structure, and a vertical projection center of the first doped region in a thickness direction of the substrate coincides with a vertical projection center of the first field plate structure in the thickness direction of the substrate.

Combining with the third aspect of the present disclosure, in an optional implementation, the laterally diffused metal oxide semiconductor device also includes a first field plate structure located above the first drift region; the first blocking structure includes a spacer structure, the spacer structure is located between the first field plate structure and the first gate structure and extends from the sidewall of the first field plate structure to the sidewall of the first gate structure, the first doped region is located in the second region below the spacer structure, and the vertical projection center of the first doped region in a thickness direction of the substrate coincides with the vertical projection center of the spacer structure in the thickness direction of the substrate.

Combining with the third aspect of the present disclosure, in an optional implementation, the substrate also includes a second drift region, and the second drift region and the first drift region are respectively located on two sides of the body region. The laterally diffused metal oxide semiconductor device also includes: a second gate structure located above a portion of the body region and a portion of the second drift region, where the second drift region also includes a third region not covered by the second gate structure; a second blocking structure located above the third region of the second drift region, where the second blocking structure is located on a side of the second gate structure away from the first gate structure; a second doped region of the second conductivity type located in the third region of the second drift region, where a doping concentration of the second doped region is lower than a doping concentration of the second drift region, and the second doped region is formed in a one-step ion implantation process together with the first doped region and the body region contact region.

An embodiment of the present disclosure provides an lateral diffusion metal oxide semiconductor device and the preparation method thereof, including: providing a substrate, where the substrate includes a first drift region of a first conductivity type and a body region of a second conductivity type; forming a first gate structure and a first blocking structure, where the first gate structure is formed above a portion of the body region and a portion of the first drift region, the body region also includes a first region not covered by the first gate structure, the first drift region also includes a second region not covered by the first gate structure, and the first blocking structure is formed above the second region of the first drift region; performing an ion implantation process, where a part of ions are implanted into the first region of the body region to form a body region contact region of the second conductivity type, and a part of ions are implanted into the second region of the first drift region after passing through the first blocking structure to form a first doped region of the second conductivity type. In this way, by forming the first doped region of the second conductivity type in the first drift region of the first conductivity type, the electric field of the first drift region can be effectively adjusted, thereby significantly improving the breakdown voltage of the device. A part of ions are implanted into the second region of the first drift region after passing through the first blocking structure to form the first doped region, so that the first doped region and the body region contact region can be formed in a one-step ion implantation process, and thus the process is simplified, the photomask is saved, and the cost can be reduced. In addition, the first doped region is formed in the second region below the first blocking structure, which can also save device area and help improve integration.

Additional aspects and advantages of the present disclosure will be set forth in part in the description below, and in part will become apparent from the description below, or will be learned through practice of the present disclosure.

BRIEF DESCRIPTION OF DRAWINGS

The drawings described herein are used to provide a further understanding of the present disclosure and constitute a part of the present disclosure. The illustrative embodiments of the present disclosure and the descriptions thereof are used to explain the present disclosure and do not constitute an improper limitation on the present disclosure. In the drawings:

FIG. 1 is a schematic cross-sectional structural diagram of a laterally diffused metal oxide semiconductor device in the related art;

FIG. 2 is a schematic flow chart of a method for preparing a laterally diffused metal oxide semiconductor device provided in an embodiment of the present disclosure;

DESCRIPTION OF REFERENCE NUMERALS

Figure 3:
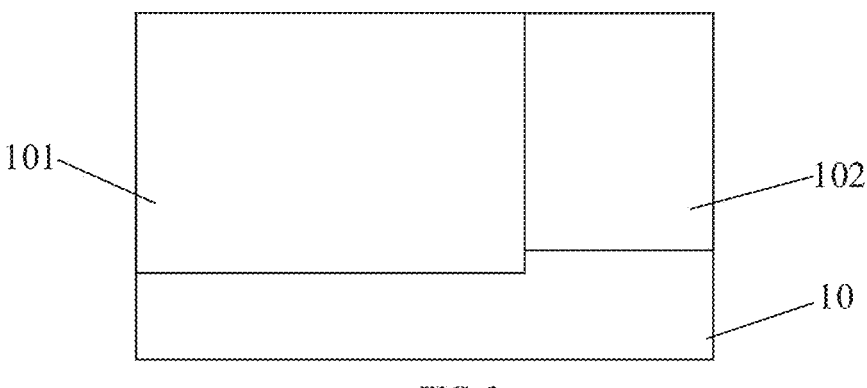
FIG. 3 is a schematic cross-sectional structural diagram of a substrate provided during the preparation process of a laterally diffused metal oxide semiconductor device provided in an embodiment of the present disclosure.

10, substrate; 101, first drift region; 102, body region; 100, first region; 200, second region; 11, first gate dielectric layer; 12, first field oxide layer; 13, conductive material layer; 131, first gate structure; 132, first field plate structure; 14, spacer material layer; 141, spacer structure; 1411, first part; 1412, second part; 142, second spacer structure; 143, third spacer structure; 161, first mask layer; 162, second mask layer; 103, body region contact region; 104, first doped region; 105, first drain region; 106, first source region; 171, first drain; 172, first field plate contact; 173, first gate contact; 174, first source; 175, body region contact; 201, second drift region; 231, second gate structure; 232, second field plate structure; 241, fourth spacer structure; 242, fifth spacer structure; 243, sixth spacer structure; 204, second doped region; 205, second drain region; 300, third region; 1, first unit; 2, second unit; 301, first side wall; 302, second side wall; 303, third side wall; 304, fourth side wall.

DETAILED DESCRIPTION

The exemplary embodiments disclosed in the present disclosure will be described in more detail below with reference to the accompanying drawings. Although the exemplary embodiments of the present disclosure are shown in the accompanying drawings, it should be understood that the present disclosure can be implemented in various forms and should not be limited by the specific embodiments described herein. On the contrary, these embodiments are provided to make the present disclosure more thoroughly understood and fully convey the scope disclosed in the present disclosure to those skilled in the art.

In the following description, a large number of specific details are given to provide more thorough understanding of the present disclosure. However, it is obvious to those skilled in the art that the present disclosure can be implemented without one or more of these details. In other examples, to avoid confusion with the present disclosure, some technical features known in the art are not described, that is, not all features of the actual embodiments are described here, and well-known functions and structures are not described in detail.

In the drawings, the sizes of a layer, a region, and an element and the relative sizes thereof may be exaggerated for clarity. Like numbers refer to like elements throughout.

It should be understood that when an element or layer is referred to as "on", "adjacent to", "connected to", or "coupled to" another element or layer, it can be directly on, adjacent to, connected to, or coupled to another element or layer, or there can be an intervening element or layer. On the contrary, when an element is referred to as "directly on", "directly adjacent to", "directly connected to", or "directly coupled to" another element or layer, there is no intervening element or layer. It should be understood that although the terms first, second, third, etc. can be used to describe various elements, parts, regions, layers and/or portions, these elements, parts, regions, layers and/or portions should not be limited by these terms. These terms are only used to distinguish one element, part, region, layer, or portion from another element, part, region, layer, or portion. Therefore, without departing from the teaching of the present disclosure, a first element, part, region, layer, or portion discussed below can be represented as a second element, part, region, layer, or part. When a second element, part, region, layer, or portion is discussed, it does not necessarily imply the existence of a first element, part, region, layer, or portion in the present disclosure.

Spatial relationship terms such as "under", "below", "lower", "beneath", "above", "upper", and the like may be used herein for convenience of description to describe the relationship between an element or a feature and another element or feature shown in the drawings. It should be understood that, in addition to the orientation indicated in the drawings, spatial relationship terms are intended to include different orientations of a device in use or operation. For example, if the device in the drawings is inverted, an element or a feature described as being "below", "beneath", or "under" another element or feature would then be oriented "above" the another element or feature. Thus, the exemplary terms "below" and "under" can include both upward and downward orientations. The device may be otherwise oriented (rotated 90 degrees or at other orientations), and the spatial description terms used herein should be interpreted accordingly.

The purpose of the terms used herein is only to describe specific embodiments and is not intended to limit the present disclosure. As used herein, the singular forms "one", "an", and "said/the" are also intended to include plural forms, unless the context clearly indicates otherwise. It should also be understood that the terms "composed of" and/or "comprise/include" when used in the specification, determine the presence of the features, integers, steps, operations, elements, and/or parts can be determined, but do not preclude the presence or addition of one or more other features, integers, steps, operations, elements, parts, and/or groups. At the same time, as used herein, the term "and/or" includes any and all combinations of related listed items.

In order to thoroughly understand the present disclosure, detailed steps and structures will be presented in the following description to illustrate the technical solutions of the present disclosure. The preferred embodiments of the present disclosure are described in detail below, but in addition to these detailed descriptions, the present disclosure may also have other implementation methods.

FIG. 1 is a schematic cross-sectional structural diagram of a laterally diffused metal oxide semiconductor (LDMOS) device in the related art. As shown in FIG. 1, the LDMOS device in the related art includes a substrate 10 and a first drift region 101 and a body region 102 located in the substrate 10. A first gate structure 131 is located above a portion of the body region 102 and a portion of the first drift region 101. A first side wall 301 and a second side wall 302 respectively cover sidewalls of the first gate structure 131. A first field plate structure 132 is located above the first drift region 101. A third side wall 303 and a fourth side wall 304 respectively cover sidewalls of the first field plate structure 132. A first drain region 105 is located in the first drift region 101 on a side of the first field plate structure 132 away from the first gate structure 131. A first source region 106 is located in the body region 102. The first drain region 105 and the first source region 106 are respectively located on two sides of the first gate structure 131. A body region contact region 103 is located in the body region 102 on a side of the first source region 106 away from the first gate structure 131. In addition, a first drain 171, a first field plate contact 172, a first gate contact 173, a first source 174, and a body region contact 175 are conductively connected to the first drain region 105, the first field plate structure 132, the first gate structure 131, the first source region 106, and the body region contact region 103, respectively, so that the first drain region 105, the first field plate structure 132, the first gate structure 131, the first source region 106, and the body region contact region 103 can be connected to an external control circuit, respectively, to apply control voltages to different parts. In the related art, by disposing the first field plate structure 132 above the first drift region 101, a surface electric field of the first drift region 101 can be adjusted by the first field plate structure 132 to improve the withstand voltage level of the device. In order to effectively improve the breakdown voltage of the device, it is generally necessary to increase an extension length of the first field plate structure 132 in a horizontal direction, which may lead to a relatively large lateral size of the device, thereby reducing the integration density of a chip. On the other hand, while improving the withstand voltage of the device, the on-resistance will also increase linearly accordingly, and it is difficult to ensure the comprehensive performance of the device.

In view of this, the present disclosure provides a method for preparing a laterally diffused metal oxide semiconductor device. FIG. 2 is a schematic flow chart of a method for preparing a metal oxide semiconductor device provided in an embodiment of the present disclosure. As shown in FIG. 2, the method includes:

Step S101, providing a substrate, where the substrate includes a first drift region of a first conductivity type and a body region of a second conductivity type.

Step S102, forming a first gate structure and a first blocking structure, where the first gate structure is formed above a portion of the body region and a portion of the first drift region, the body region also includes a first region not covered by the first gate structure, the first drift region also includes a second region not covered by the first gate structure, and the first blocking structure is formed above the second region of the first drift region.

Step S103, performing an ion implantation process, where a part of ions are implanted into the first region of the body region to form a body region contact region of the second conductivity type, and a part of ions are implanted into the second region of the first drift region after passing through the first blocking structure to form a first doped region of the second conductivity type.

It can be understood that, through the above method, by forming the first doped region of the second conductivity type in the first drift region of the first conductivity type, the electric field of the first drift region can be effectively adjusted, thereby significantly improving the breakdown voltage of the device. Moreover, a part of ions are implanted into the second region of the first drift region after passing through the first blocking structure to form the first doped region, so that the first doped region and the body region contact region can be formed in a one-step ion implantation process, and thus the process is simplified, the photomask is saved, and the cost can be reduced. In addition, the first doped region is formed in the second region below the first blocking structure, which can also save device area, thereby facilitating improving integration.

It should also be understood that, although the steps in the above schematic flowchart are shown in sequence as indicated by arrows, these steps are not necessarily performed in order indicated by the arrows. Moreover, at least a part of the steps in the above schematic flowchart may include a plurality of steps or stages, and these steps or stages are not necessarily completed at the same time, nor are they necessarily performed in sequence.

Hereinafter, a method for preparing a metal oxide semiconductor device and its beneficial effects provided in an embodiment of the present disclosure will be further described in detail combining with FIG. 3 to FIG. 15.

Firstly, please refer to FIG. 3, step S101 is performed to provide a substrate 10. The substrate 10 includes a first drift region 101 of a first conductivity type and a body region 102 of a second conductivity type.

Exemplarily, the substrate 10 may include a semiconductor substrate, and the material of the substrate 10 may be, for example, at least one of single crystal silicon, polycrystalline silicon, amorphous silicon, doped silicon, silicon germanium, or silicon carbide. In an actual preparation process, an ion implantation process may be used to implant impurities of different conductivity types into the substrate 10 to form the first drift region 101 and the body region 102. For example, impurities of the first conductivity type may be implanted into the substrate 10 to form the first drift region 101 of the first conductivity type, and impurities of the second conductivity type may be implanted into the substrate 10 to form the body region 102 of the second conductivity type. The second conductivity type is different from the first conductivity type, and in a case that the first conductivity type is N-type or P-type, the second conductivity type is P-type or N-type accordingly. For example, when the laterally diffused metal oxide semiconductor device is an N-type LDMOS device, the first conductivity type is N-type, and the second conductivity type is P-type, and when the laterally diffused metal oxide semiconductor device is a P-type LDMOS device, the first conductivity type is P-type, and the second conductivity type is N-type.

It should be noted that the adjacent arrangement of the first drift region 101 and the body region 102 in FIG. 3 is only an example, and in some other embodiments of the present disclosure, a case that the body region 102 is located in the first drift region 101 or the first drift region 101 is located in the body region 102 is not excluded.

Subsequently, please refer to FIG. 4 to FIG. 8, step S102 is performed to form a first gate structure 131 and a first blocking structure. The first gate structure 131 is formed above a portion of the body region 102 and a portion of the first drift region 101, the body region 102 includes a first region 100 not covered by the first gate structure 131, the first drift region 101 also includes a second region 200 not covered by the first gate structure 131, and the first blocking structure is formed above the second region 200 of the first drift region 101.

Figure 4:
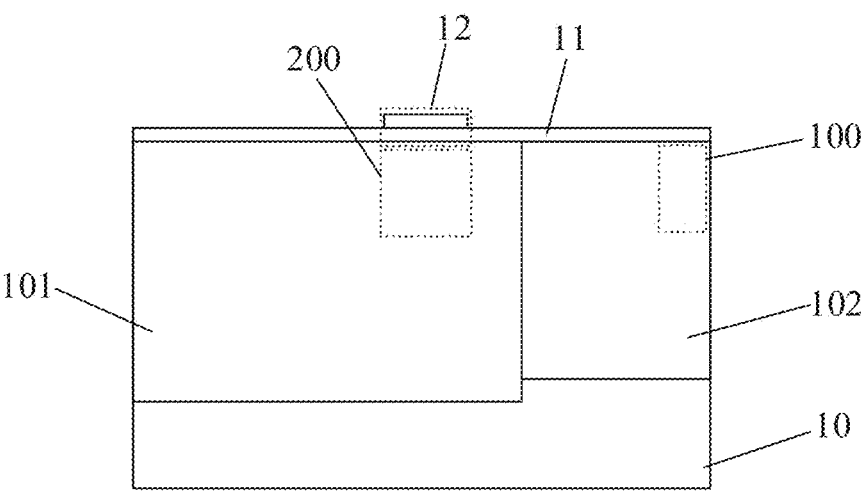
FIG. 4 is a schematic cross-sectional structural diagram of a first gate dielectric layer and a first field oxide layer formed during the preparation process of a laterally diffused metal oxide semiconductor device provided in an embodiment of the present disclosure.

In some embodiments, performing step S102 may include performing the following steps:

Step S1021: please refer to FIG. 4, a first gate dielectric layer 11 and a first field oxide layer 12 are sequentially formed on a surface of the substrate 10, and the first field oxide layer 12 is located above the second region 200.

Figure 5:
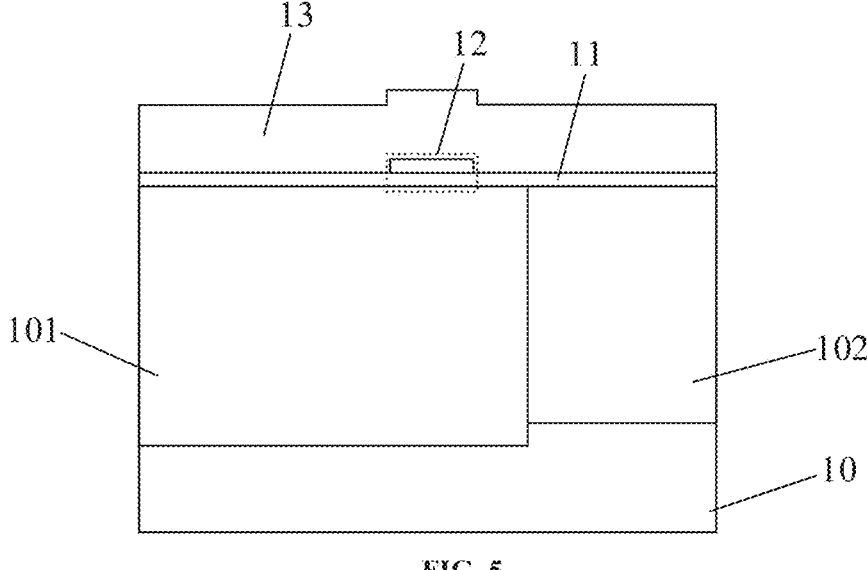
FIG. 5 is a schematic cross-sectional structural diagram of a conductive material layer formed during the preparation process of a laterally diffused metal oxide semiconductor device provided in an embodiment of the present disclosure.

Step S1022: please refer to FIG. 5, a conductive material layer 13 covering the first gate dielectric layer 11 and the first field oxide layer 12 is formed.

Figure 6:
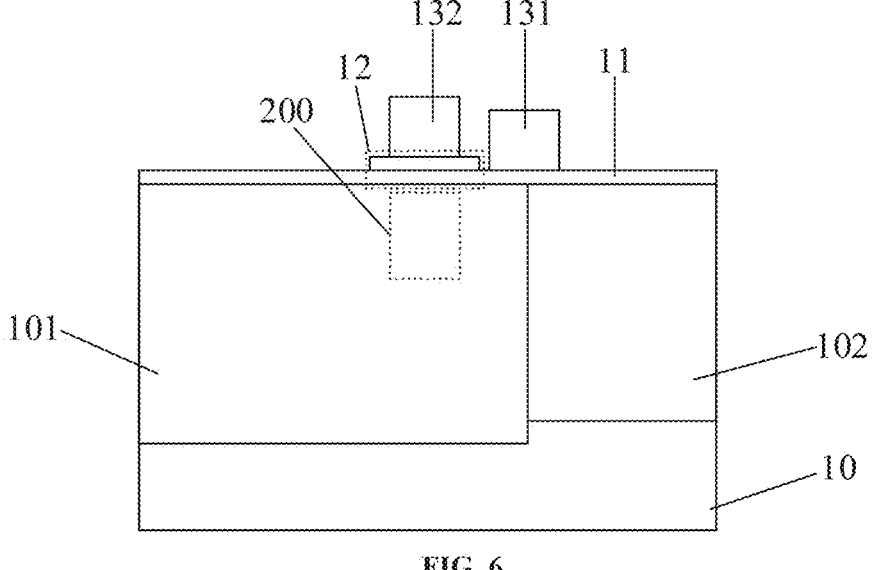
FIG. 6 is a schematic cross-sectional structural diagram of a first gate structure and a first field plate structure formed during the preparation process of a laterally diffused metal oxide semiconductor device provided in an embodiment of the present disclosure.

Step S1023: please refer to FIG. 6, a portion of the conductive material layer 13 located above the first gate dielectric layer 11 and the first field oxide layer 12 is etched and removed to form the first gate structure 131 and the first field plate structure 132 located above the second region 200.

Exemplarily, the first gate dielectric layer 11 can be formed by adopting at least one of thermal oxidation process, physical vapor deposition, chemical vapor deposition, or atomic layer deposition process. For the first field oxygen layer 12, at least one of physical vapor deposition, chemical vapor deposition, or atomic layer deposition process can be firstly adopted to form a first field oxygen material layer (not shown in the drawings), and then a portion of the first field oxygen material layer can be etched and removed, and the remaining first field oxygen material layer and the first gate dielectric layer 11 located below the remaining first field oxygen material layer together form the first field oxygen layer 12 as shown in FIG. 4. In some other embodiments of the present disclosure, a case that the first gate dielectric layer 11 and the first field oxygen layer 12 are formed in a one-step process is not excluded. For example, a dielectric layer (not shown in the drawings) is firstly formed, and then a portion of the dielectric layer is etched and removed to simultaneously form the first gate dielectric layer 11 and the first field oxygen layer 12, where the material of the dielectric layer can include oxide. The conductive material layer 13 can be formed by a process such as a sputtering process and/or an electroplating process, etc., where the material of the conductive material layer 13 can include at least one of metal, doped polysilicon, or any conductive material or semiconductor material. The conductive material layer 13 may be etched adopting the dry etching process, such as plasma etching process.

The first field plate structure 132 in the embodiment of the present disclosure can constitute a first blocking structure. On one hand, the first field plate structure 132 can serve as the first blocking structure, and on the other hand, it can also serve as a field plate of the device to play the role of dividing a voltage, thereby further improving the withstand voltage level of the device. In the embodiment of the present disclosure, the first gate structure 131 and the first field plate structure 132 are formed in a one-step process, thereby simplifying the process. In some other embodiments of the present disclosure, a case that the first gate structure 131 and the first field plate structure 132 are formed respectively in different process steps is not excluded.

Figure 7:
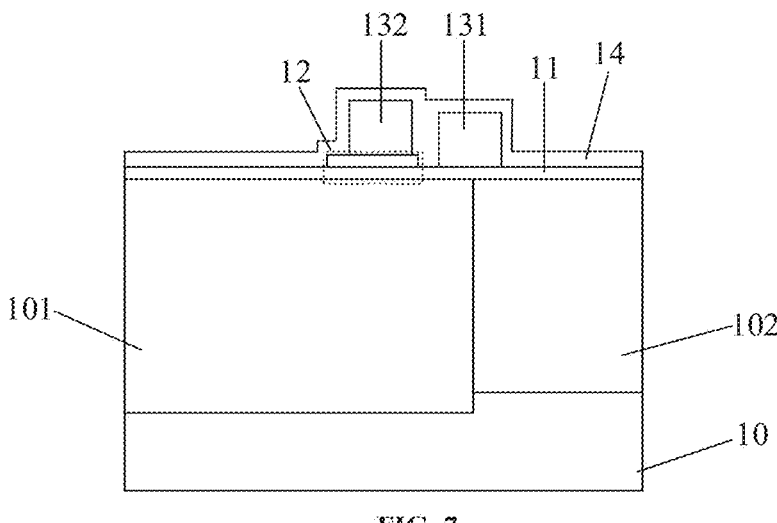
FIG. 7 is a schematic cross-sectional structural diagram of a spacer material layer formed during the preparation process of a laterally diffused metal oxide semiconductor device provided in an embodiment of the present disclosure.

In some embodiments, the method for preparing the laterally diffused metal oxide semiconductor device may further include the following steps:

Step S1024: please refer to FIG. 7, a spacer material layer 14 is formed to conformally cover the first gate dielectric layer 11, the first field oxide layer 12, the first field plate structure 132, and the first gate structure 131.

Figures 8, 9:
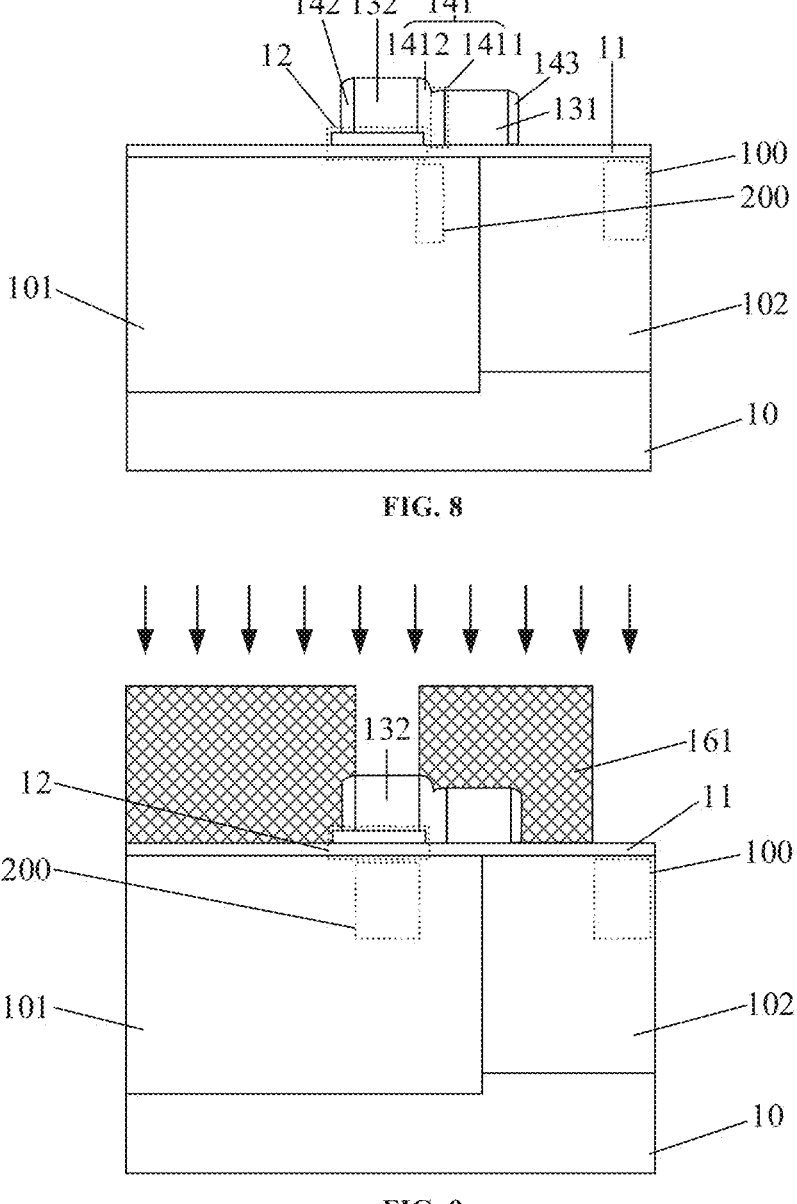
FIG. 8 is a schematic cross-sectional structural diagram of a spacer structure, a second spacer structure, and a third spacer structure formed during the preparation process of a laterally diffused metal oxide semiconductor device provided in an embodiment of the present disclosure.
FIG. 9 is a schematic cross-sectional structural diagram of a first mask layer formed during the preparation process of a laterally diffused metal oxide semiconductor device provided in an embodiment of the present disclosure.

Step S1025: please refer to FIG. 8, a portion of the spacer material layer 14 is removed to form a spacer structure 141 (also referred to as a first spacer structure) located between the first gate structure 131 and the first field plate structure 132, a second spacer structure 142, and a third spacer structure 143. The spacer structure 141 is located between the first field plate structure 132 and the first gate structure 131 and extends from a sidewall of the first field plate structure 132 to a sidewall of the first gate structure 131, and the second spacer structure 142 and the third spacer structure 143 respectively cover the other sidewall of the first field plate structure 132 and the other sidewall of the first gate structure 131.

Exemplarily, the spacer material layer 14 may be formed by at least one process of physical vapor deposition, chemical vapor deposition, or atomic layer deposition. For example, the material of the spacer material layer 14 may include at least one of oxide, nitride, or oxynitride. A process such as the dry etching and/or wet etching process may be adopted to remove a portion of the spacer material layer 14.

In the embodiment of the present disclosure, the spacer structure 141 can constitute the first blocking structure. It can be understood that, in the device, please refer to FIG. 8, the spacer structure 141 can be divided into a first part 1411 located in a dotted box, and a second part 1412 located outside the dotted box. The first part 1411 and the third spacer structure 143 can serve as the side walls of the first gate structure 131, and can constitute a complete gate together with the first gate structure 131 and the first gate dielectric layer 11 to play the role of the gate in the device. The second part 1412 and the second spacer structure 142 can serve as the side walls of the first field plate structure 132, and constitute a complete field plate together with the first field plate structure 132 and the first field oxide layer 12 to play the role of the field plate in the device.

In the embodiment of the present disclosure, the spacer structure 141, the second spacer structure 142, and the third spacer structure 143 are formed in a one-step process, thereby simplifying the process. In some other embodiments of the present disclosure, a case that the spacer structure 141, the second spacer structure 142, and the third spacer structure 143 are formed by adopting a multi-step process is not excluded. A formation order of the spacer structure 141, the second spacer structure 142, and the third spacer structure 143 may not be limited. The specific preparation process may adopt a process well known to those skilled in the art, which will not be repeated here.

In addition, FIG. 7 exemplarily shows that the formed spacer material layer 14 includes a structure of a single layer.

In some other embodiments of the present disclosure, the spacer material layer 14 may include a structure of two or more layers, for example, the spacer material layer 14 sequentially includes an oxide layer and a nitride layer from bottom to top, or sequentially includes an oxide layer, a nitride layer, and an oxide layer from bottom to top.

Finally, please refer to FIG. 9 to FIG. 12, Step S103 is executed to perform an ion implantation process, where a part of ions are implanted into the first region 100 of the body region 102 to form a body region contact region 103 of the second conductivity type, and a part of ions are implanted into the second region 200 of the first drift region 101 after passing through the first blocking structure to form a first doped region 104 of the second conductivity type.

In an LDMOS device, the body region contact region 103 is usually a heavily doped region to connect the body region to an external circuit while maintaining a low contact resistance. Therefore, in the ion implantation process for forming the body region contact region 103, the ion implantation dose is relatively large, and the ion implantation concentration may be greater than or equal to $10^{15}$ ions/cm$^2$. However, the first doped region 104 in the embodiment of the present disclosure generally requires a lower doping concentration to effectively improve the withstand voltage level of the device. Therefore, the formation of the first doped region 104 and the formation of the body region contact region 103 cannot generally be formed in a one-step ion implantation process. That is, if the first doped region 104 is to be formed to improve the withstand voltage level of the device, an additional one-step ion implantation process needs to be added, and an additional mask needs to be added to form the first doped region 104, which causes the process complicated and the cost high. In the embodiment of the present disclosure, by forming the first blocking structure, the ion concentration actually implanted into the second region 200 is lower than the ion concentration implanted into the first region 100 after part of the ions pass through the first blocking structure. After the part of ions pass through the first blocking structure, the ion concentration implanted into the second region 200 can be, for example, $10^{11}$ ions/cm$^2$-$10^{14}$ ions/cm$^2$, so that the first doped region 104 and the body region contact region 103 can be formed in a one-step ion implantation process, thereby simplifying the process, saving masks, and reducing costs. In the embodiment of the present disclosure, by forming the first doped region 104 of the second conductivity type in the first drift region 101 of the first conductivity type, since the first doped region 104 and the first drift region 101 have different conductivity types, the first doped region 104 can assist in the depletion of the first drift region 101, and can effectively adjust the electric field of the first drift region 101, flatten the peak electric field on a surface of the substrate 10, and improve the avalanche breakdown voltage on the surface of the substrate 10, thereby significantly improving the breakdown voltage of the device. Moreover, the first doped region 104 is formed below the first blocking structure, which can also save device area and facilitate improving integration.

In some embodiments, performing the ion implantation process may include the following steps:

Firstly, please refer to FIG. 9, a first mask layer 161 is formed, and the first mask layer 161 exposes a surface of the first field plate structure 132 and a surface of the first region 100.

Figures 10, 11:
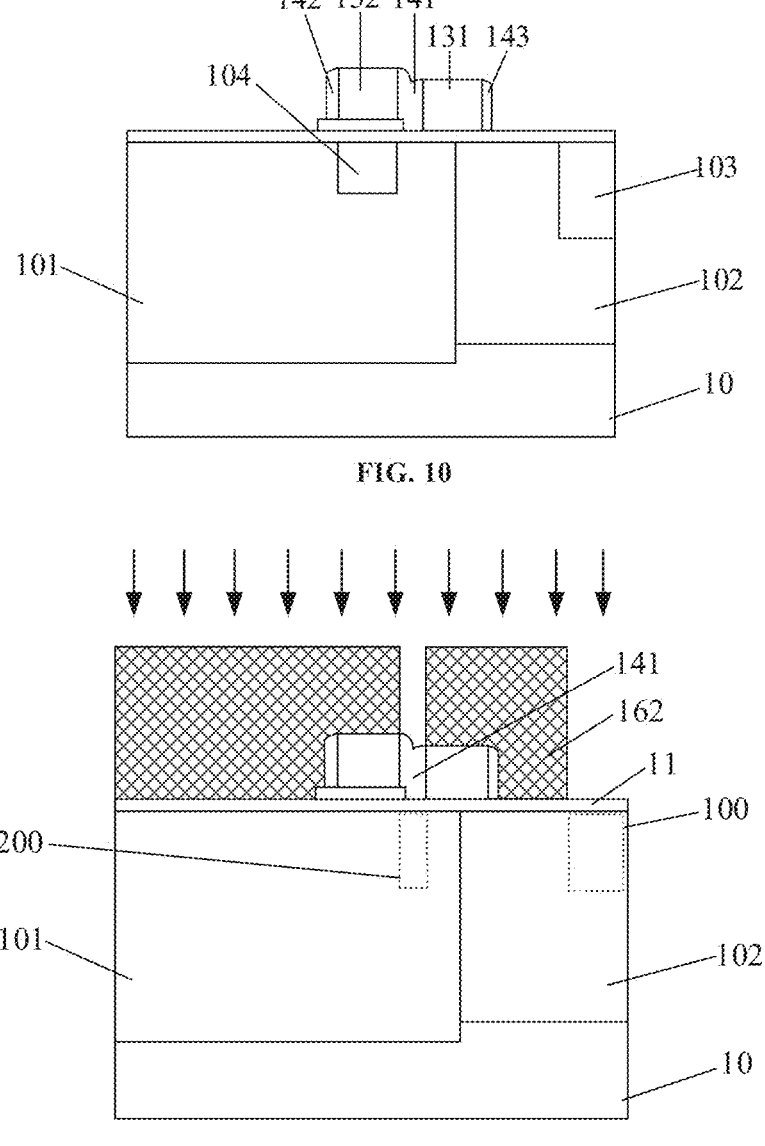
FIG. 10 is a schematic cross-sectional structural diagram of a first doped region and a body region contact region formed during the preparation process of a laterally diffused metal oxide semiconductor device provided in an embodiment of the present disclosure.
FIG. 11 is a schematic cross-sectional structural diagram of a second mask layer formed during the preparation process of a laterally diffused metal oxide semiconductor device provided in an embodiment of the present disclosure.

Next, please refer to FIG. 9 and FIG. 10, the ion implantation process is performed by using the first mask layer 161 as a mask (please refer to FIG. 9) to form the first doped region 104 and the body region contact region 103 (please refer to FIG. 10).

In an actual preparation process, firstly, a photoresist may be spin-coated or spray-coated on the first gate dielectric layer 11, the first field oxide layer 12, the second spacer structure 142, the first field plate structure 132, the spacer structure 141, the first gate structure 131, and the third spacer structure 1431; and then exposure and development are performed to form the first mask layer 161 as shown in FIG. 9. Since the first gate dielectric layer 11 formed by the aforementioned process covers the surface of the substrate 10, in this case, the first mask layer 161 exposes the surface of the first field plate structure 132 and the surface of the first gate dielectric layer 11 located on the first region 100. It should be noted that a thickness of the first gate dielectric layer 11 is generally very thin. For example, the first gate dielectric layer 11 may be a thermal oxidation layer formed by a thermal oxidation process. Therefore, the first gate dielectric layer 11 has substantially no effect on the subsequent ion implantation of the first region 100. In some other embodiments of the present disclosure, the first gate dielectric layer 11 may not cover the first region 100. In this case, the formed first mask layer 161 may expose the surface of the first field plate structure 132 and the surface of the first region 100. In the actual preparation process, when the device is an N-type LDMOS, the conductivity type of the first drift region 101 is N-type, the conductivity type of the body region 102 is P-type, and the implanted ions can be P-type ions, such as boron ions and/or aluminum ions. When the device is a P-type LDMOS, the conductivity type of the first drift region 101 is P-type, the conductivity type of the body region 102 is N-type, and the implanted ions can be N-type ions, such as phosphorus ions and/or arsenic ions. The ions may be implanted along a direction indicated by an arrow in FIG. 9 to form the first doped region 104 and the body region contact region 103 as shown in FIG. 10.

In the embodiment of the present disclosure, the first field plate structure 132 is generally formed by photolithography and etching processes, so an extension length of the first field plate structure 132 along a horizontal direction can be flexibly adjusted according to actual needs. Therefore, during performing the ion implantation process, the extension length of the first doped region 104 formed in the first drift region 101 in the horizontal direction can also be flexibly adjusted accordingly through the blocking of the first field plate structure 132. For example, in some cases, the extension length of the first doped region 104 in the horizontal direction can be appropriately increased to better improve the withstand voltage level of the device. When the first field plate structure 132 is made of a semiconductor material, during performing the ion implantation process, the first field plate structure 132 is used as a block structure, and thus the doping concentration of the semiconductor material can also be increased, which is beneficial to reducing the resistance of the first field plate structure 132.

It should be noted that, as shown in FIG. 9, the first field plate structure 132 is located above the first field oxygen layer 12. The first doped region 104 is formed in the first drift region 101 through the blocking of the first field plate structure 132 in the embodiment of the present disclosure. It can also be understood that the first doped region 104 is formed in the first drift region 101 through the blocking of the first field plate structure 132 and the first field oxygen layer 12.

In some embodiments, performing the ion implantation process may include the following steps:

Firstly, please refer to FIG. 11, a second mask layer 162 is formed, and the second mask layer 162 exposes a surface of the spacer structure 141 and a surface of the first region 100.

Figure 12:
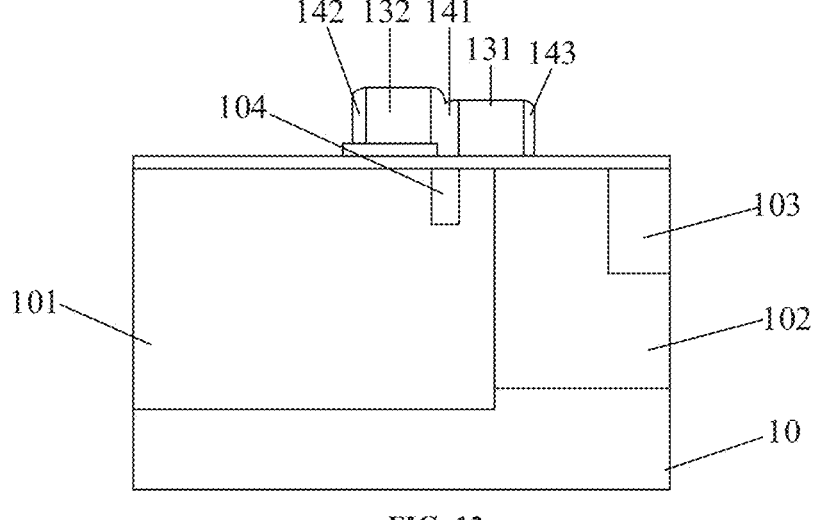
FIG. 12 is a schematic cross-sectional structural diagram of a first doped region and a body region contact region formed during the preparation process of another laterally diffused metal oxide semiconductor device provided in an embodiment of the present disclosure.

Next, please refer to FIG. 11 and FIG. 12, an ion implantation process is performed using the second mask layer 162 as a mask (please refer to FIG. 11) to form the first doped region 104 and the body region contact region 103 (please refer to FIG. 12).

In the embodiment of the present disclosure, the process of forming the second mask layer 162 and the process of performing ion implantation can be understood referring to the above process of forming the first mask layer 161 and the above process of performing ion implantation respectively, and will not be described in detail here. Similar to the above embodiment, when the first gate dielectric layer 11 is formed to cover the surface of the substrate 10, the second mask layer 162 exposes the surface of the spacer structure 141 and the surface of the first gate dielectric layer 11 located on the first region 100. In some other embodiments of the present disclosure, the first gate dielectric layer 11 may not cover the first region 100. In this case, the formed second mask layer 162 may expose the surface of the spacer structure 141 and the surface of the first region 100. In an actual preparation process, ions can be implanted along a direction indicated by an arrow in FIG. 11 to form the first doped region 104 and the body region contact region 103 as shown in FIG. 12.

In the embodiment of the present disclosure, the spacer structure 141 is generally formed by the dry etching and/or wet etching process, so an extension length of the spacer structure 141 along the horizontal direction depends on a process node and the actual preparation process. Generally, in a process with a small node, the first doped region 104 can be formed by the blocking of the spacer structure 141 during the ion implantation process. In addition, in the actual preparation process, as shown in FIG. 12, surfaces of the formed spacer structure 141, a second spacer structure 142, and a third spacer structure 143 generally form an arc structure, so that in a direction away from the first field plate structure 132 or the first gate structure 131, distances between the surfaces of the spacer structure 141, the second spacer structure 142, and the third spacer structure 143 and the substrate 10 have a tendency to gradually decrease within a certain region. By adjusting the dry etching and/or wet etching process in the actual preparation process, the morphology of the spacer structure 141 can be adjusted. Therefore, in the ion implantation process, the first doped region 104 is formed by using the spacer structure 141 as a blocking structure, which can make the process more flexible.

In some other embodiments of the present disclosure, when performing the ion implantation process, it is not excluded that a combination of the first field plate structure 132, the spacer structure 141, and the second spacer structure 142 is used as a blocking structure to form the first doped region 104. For example, a combination of a portion of the first field plate structure 132, a portion or all of the first field plate structure 132, and a portion or all of the second spacer structure 142, a combination of a portion or all of the first field plate structure 132 and a portion or all of the spacer structure 141, and the like can be used as the blocking structure to form the first doped region 104, and accordingly, the first doped region 104 is formed in the second region 200 below a portion that actually serves as the blocking structure.

In some embodiments, a doping concentration of the first doped region 104 may be lower than a doping concentration of the first drift region 101.

In the embodiment of the present disclosure, the first drift region 101 is generally lightly doped to improve the withstand voltage level of the device. The doping concentration of the first doped region 104 is lower than the doping concentration of the first drift region 101, which can further improve the withstand voltage level of the device on the basis of assisting the depletion of the drift region.

Figure 13:
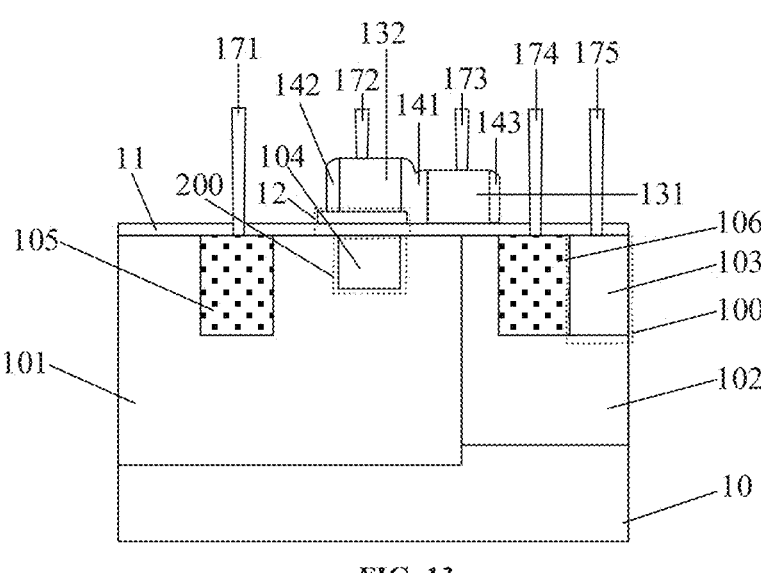
FIG. 13 is a schematic cross-sectional structural diagram of a first drain region, a first source region, a first drain, a first field plate contact, a first gate contact, a first source, and a body region contact formed during the preparation process of a laterally diffused metal oxide semiconductor device provided in an embodiment of the present disclosure.
Figure 14:
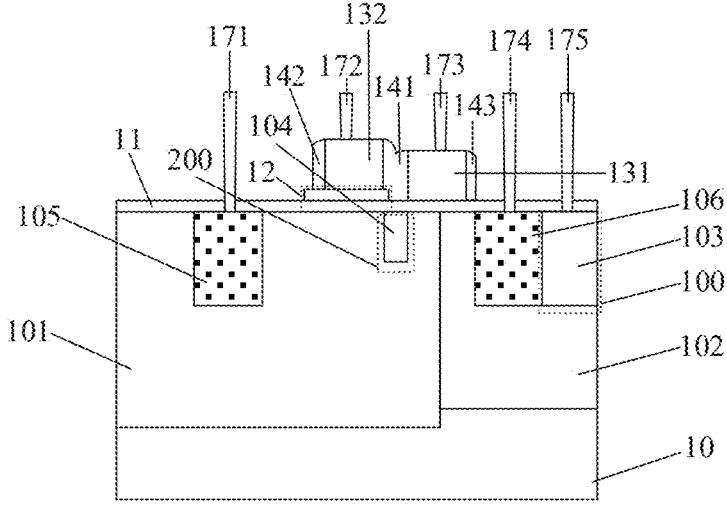
FIG. 14 is a schematic cross-sectional structural diagram of a first drain region, a first source region, a first drain, a first field plate contact, a first gate contact, a first source, and a body region contact formed during the preparation process of another laterally diffused metal oxide semiconductor device provided in an embodiment of the present disclosure.

In some specific embodiments, please refer to FIGS. 13 and 14, the method for preparing the laterally diffused metal oxide semiconductor device may also include: forming a first drain region 105, where the first drain region 105 is formed in the first drift region 101 on a side of the first field plate structure 132 away from the first gate structure 131; forming a first source region 106, where the first source region 106 is formed in the body region 102, and the first source region 106 is located between the first gate structure 131 and the body region contact region 103.

Exemplarily, the first drain region 105 and the first source region 106 may be formed by adopting an ion implantation process, and steps of forming the first drain region 105 and the first source region 106 may be performed before or after the step of forming the body region contact region 103.

In some specific embodiments, please continue to refer to FIGS. 13 and 14, the method for preparing the laterally diffused metal oxide semiconductor device may also include: forming a first drain 171, a first field plate contact 172, a first gate contact 173, a first source 174, and a body region contact 175 that are conductively connected to the first drain region 105, the first field plate structure 132, the first gate structure 131, the first source region 106, and the body region contact region 103, respectively.

The first drain 171, the first field plate contact 172, the first gate contact 173, the first source 174, and the body region contact 175 in the embodiment of the present disclosure are respectively configured to connect the first drain region 105, the first field plate structure 132, the first gate structure 131, the first source region 106, and the body region contact region 103 to an external control circuit. Processes of forming the first drain 171, the first field plate contact 172, the first gate contact 173, the first source 174, and the body region contact 175 can adopt processes well known to those skilled in the art, and will not be repeated here.

It can be understood that the structure shown in FIG. 13 is formed by adopting the above process on the basis of the structure shown in FIG. 10, and the structure shown in FIG. 14 is formed by adopting the above process on the basis of the structure shown in FIG. 12.

Figure 15:
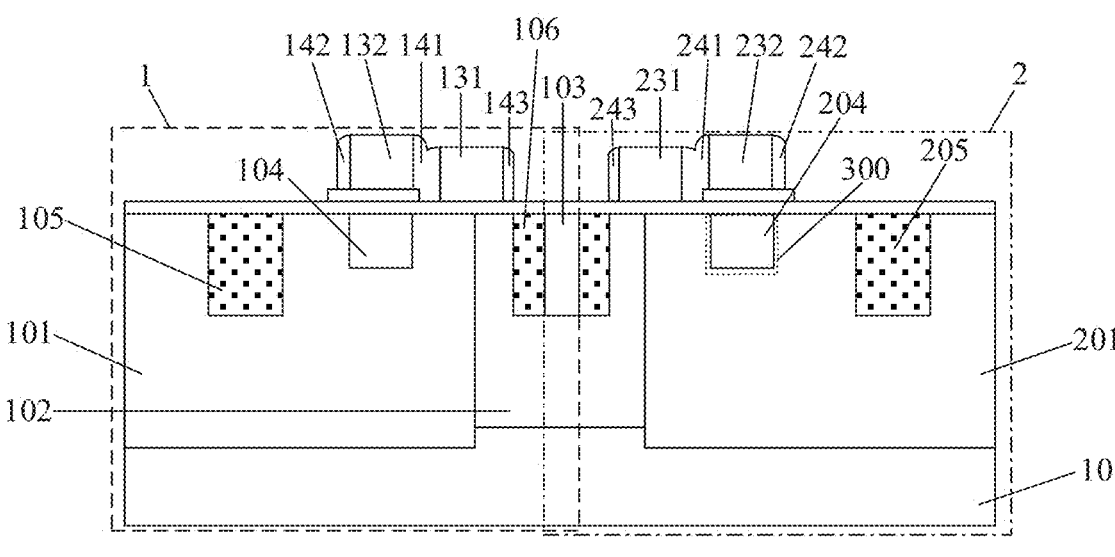
FIG. 15 is a schematic cross-sectional structural diagram of a second gate structure and a second blocking structure formed during the preparation process of a laterally diffused metal oxide semiconductor device provided in an embodiment of the present disclosure.

In some embodiments, please refer to FIG. 15, the substrate 10 may further include a second drift region 201, where a second drift region 201 and the first drift region 101 are respectively located on two sides of the body region 102, and the method for preparing the laterally diffused metal oxide semiconductor device may further include:

Forming a second gate structure 231 and a second blocking structure, where the second gate structure 231 is formed above a portion of the body region 102 and a portion of the second drift region 201, the second drift region 201 also includes a third region 300 not covered by the second gate structure 231, the second blocking structure is formed above a third region 300 of the second drift region 201, and the second blocking structure is located on a side of the second gate structure 231 away from the first gate structure 131. During the ion implantation process, a part of the ions are implanted into the third region 300 of the second drift region 201 after passing through the second blocking structure to form a second doped region 204 of the second conductivity type.

The role of the second doped region 204 formed in the embodiment of the present disclosure can be understood with reference to the role of the first doped region 104 formed in the aforementioned embodiment. Since the second doped region 204, the first doped region 104, and the body region contact region 103 can be formed in the one-step ion implantation process, thereby simplifying the process and saving the cost. The process of forming the second gate structure 231 and the second blocking structure can be understood with reference to the process of forming the first gate structure 131 and the first blocking structure in the aforementioned embodiment. The formed second blocking structure may include a second field plate structure 232 or a fourth spacer structure 241 as shown in FIG. 15, and the fourth spacer structure 241 is formed between the second gate structure 231 and the second field plate structure 232 and extends from a sidewall of the second gate structure 231 to a sidewall of the second field plate structure 232.

In some specific embodiments, the method for preparing the laterally diffused metal oxide semiconductor device may also include: forming a sixth spacer structure 243 and a fifth spacer structure 242 covering another sidewall of the second gate structure 231 and another sidewall of the second field plate structure 232, and forming a second drain region 205, where the second drain region 205 is formed in a second drift region 201 on a side of the second field plate structure 232 away from the second gate structure 231.

As shown in FIG. 15, in the embodiment of the present disclosure, the finally formed device structure may include a first unit 1 and a second unit 2 with similar structures. The first unit 1 and the second unit 2 may share a first source region 106 and a body region contact region 103. A composition structure, role, and formation process of each part of the first unit 1 may be understood with reference to the above-mentioned embodiment. A composition structure, role, and formation process of each part in the second unit 2 may be understood with reference to the composition structure, role and formation process of a corresponding part in the first unit 1. For example, the first drift region 101 corresponds to the second drift region 201, the first gate structure 131 corresponds to the second gate structure 231, the first blocking structure corresponds to the second blocking structure, the first doped region 104 corresponds to the second doped region 204, and the first drain region 105 corresponds to the second drain region 205, etc. It can be understood that the corresponding parts in the first unit 1 and the second unit 2 may be formed in a one-step process to simplify the process. Of course, it is not excluded that the corresponding parts in the first unit 1 and the second unit 2 are formed in different steps of the process.

Figure 16:
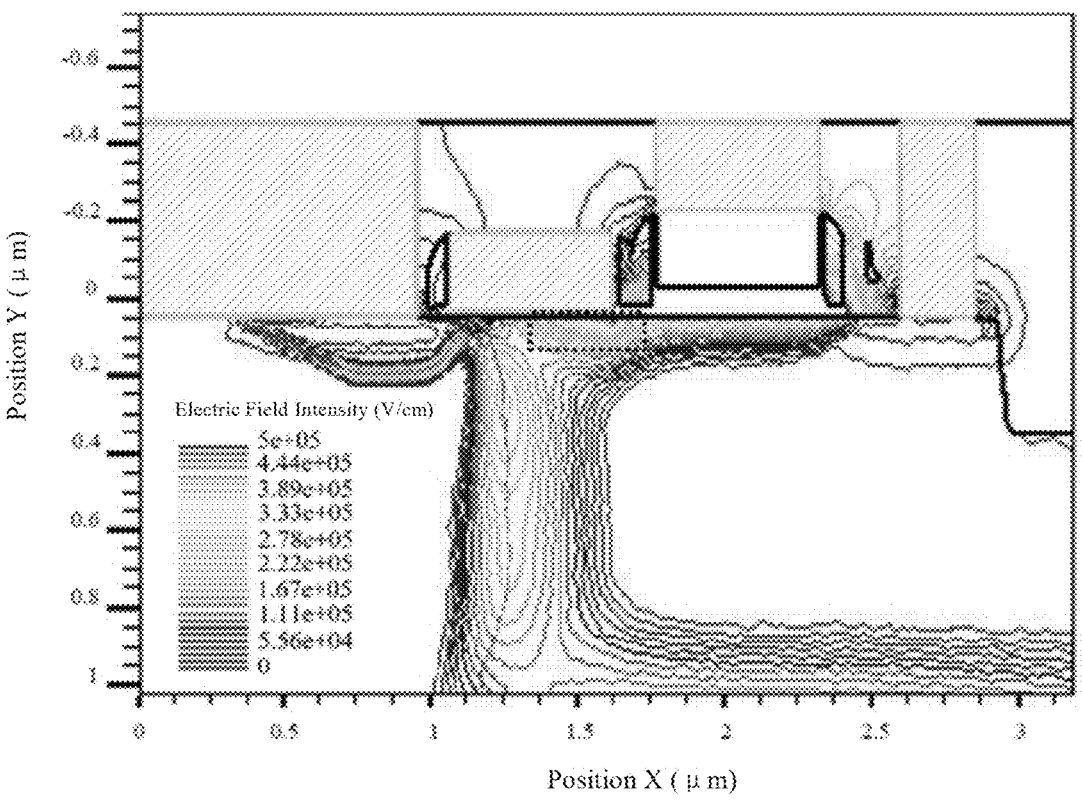
FIG. 16 is a schematic simulation diagram illustrating electric field intensity distribution of a laterally diffused metal oxide semiconductor device in the related art.

FIG. 16 is a schematic simulation diagram illustrating electric field intensity distribution of a laterally diffused metal oxide semiconductor device in the related art. The corresponding device structure in FIG. 16 can be understood with reference to the device structure shown in FIG. 1.

Please refer to FIG. 16, in the related art, a peak electric field near the surface of the substrate 10 of the device is concentrated below the first gate structure 131 (as shown by a dotted box in FIG. 16). The electric field is mainly concentrated on the surface of the substrate 10, which reduces the avalanche breakdown voltage on the surface of the substrate 10. The concentration of the electric field will cause premature breakdown on the surface of the substrate 10.

Figure 17:
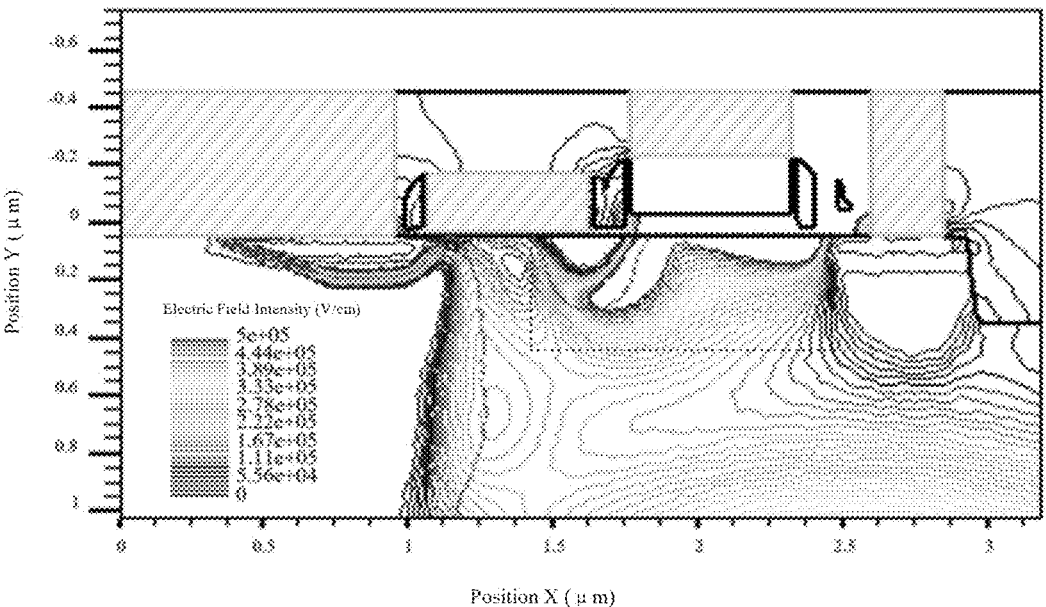
FIG. 17 is a schematic simulation diagram illustrating electric field intensity distribution of a laterally diffused metal oxide semiconductor device prepared in an embodiment of the present disclosure.

FIG. 17 is a schematic simulation diagram illustrating electric field intensity distribution of a laterally diffused metal oxide semiconductor device prepared in an embodiment of the present disclosure. The corresponding device structure in FIG. 17 can be understood with reference to the device structure shown in FIG. 13.

Please refer to FIG. 17, for the laterally diffused metal oxide semiconductor device prepared in the embodiment of the present disclosure, the electric field distribution on the surface of the substrate 10 (as shown by a dotted box in FIG. 17) is obviously more dispersed compared with the electric field distribution on the surface of the substrate 10 in the prior art. The electric field is dispersed from the surface of the substrate 10 to the inside of the substrate 10. A peak value of the electric field intensity below the first gate structure 131 is significantly reduced. By regulating the electric field by the first doped region 104 and combining with the voltage-dividing effect of the first plate structure 132, the interface electric field distribution is changed and the peak electric field on the surface of the substrate 10 is flattened, so that a breakdown point moves from the surface of the substrate 10 to the inside of the substrate 10, thereby increasing the avalanche breakdown voltage on the surface of the substrate 10, and thus effectively improving the withstand voltage level of the device.

Table 1 shows performance parameters of the laterally diffused metal oxide semiconductor device prepared in the embodiment of the present disclosure and the laterally diffused metal oxide semiconductor device in the related art. The device structure in the embodiment of the present disclosure can be understood with reference to the device structure shown in FIG. 13, and the device in the related art can be understood with reference to the device structure shown in FIG. 1.

TABLE 1

| Performance parameters | Ron, sp (mΩ ■ mm$^2$) | BV (V) | FOM (BV$^2$/Ron, sp, MW/cm$^2$) |
|---|---|---|---|
| Device in the embodiment of the present disclosure | 35.8 | 27.8 | 21.59 |
| Device in the related art | 12.3 | 5.9 | 2.83 |

It can be seen from the data in Table 1 that the BV value of the device in the embodiment of the present disclosure is significantly improved relative to the BV value of the device in the related art. It can be understood that, in order to improve the BV in the device, it is inevitable that Ron,sp will be increased accordingly. Although the value of Ron,sp of the device in the embodiment of the present disclosure is improved relative to the value of Ron,sp of the device in the related art, the Ron,sp of the device in the embodiment of the present disclosure is still relatively low relative to a high BV value of the device in the embodiment of the present disclosure. The FOM (Figure of merit) in Table 1 can be used to evaluate the performance of the device, that is, in a case that Ron,sp remains unchanged, the larger the BV is, the better the performance is, or in a case that BV remains unchanged, the lower the Ron,sp is, the better the performance is, so the larger the FOM value is, the better the performance of the device is. It can be seen from the data in Table 1 that the performance of the device in the embodiment of the present disclosure is obviously better than the performance of the device in the related art. While the performance of the device is improved, the preparation process of the device in the embodiment of the present disclosure is simple and the cost is low.

In view of this, an embodiment of the present disclosure also provides a laterally diffused metal oxide semiconductor device, which is prepared by adopting the steps of the method for preparing the laterally diffused metal oxide semiconductor device provided in any of the aforementioned embodiments.

In view of this, an embodiment of the present disclosure further provides another laterally diffused metal oxide semiconductor device. As shown in FIG. 13, the laterally diffused metal oxide semiconductor device includes:

a substrate 10;

a first drift region 101 of a first conductivity type and a body region 102 of a second conductivity type respectively located in the substrate 10;

a first gate structure 131 located above a portion of the body region 102 and a portion of the first drift region 101, where the body region 102 further includes a first region 100 not covered by the first gate structure 131, and the first drift region 101 further includes a second region 200 not covered by the first gate structure 131;

a first blocking structure located above the second region 200 of the first drift region 101;

a body region contact region 103 of a second conductivity type located in the first region 100 of the body region 102; and a first doped region 104 of a second conductivity type located in the second region 200 of the first drift region 101, where a doping concentration of the first doped region 104 is lower than a doping concentration of the first drift region 101.

In the embodiment of the present disclosure, the first doped region 104 of the second conductivity type is located in the first drift region 101 of the first conductivity type. Since the first doped region 104 and the first drift region 101 have different conductivity types, the first doped region 104 can assist in the depletion of the first drift region 101, and can effectively adjust the electric field of the first drift region 101, flatten the peak electric field on the surface of the substrate 10, and improve the avalanche breakdown voltage on the surface of the substrate 10. Generally, the first drift region 101 is lightly doped to improve the withstand voltage level of the device. The doping concentration of the first doped region 104 is lower than the doping concentration of the first drift region 101, so that the withstand voltage level of the device can be better improved on the basis of assisting the depletion of the drift region, thereby significantly improving the breakdown voltage of the device. Moreover, the first doped region 104 is formed below the first blocking structure, which can also save the device area and improve the integration.

In some embodiments, please continue to refer to FIG. 13, the first blocking structure includes a first field plate structure 132, the first doped region 104 is located in the second region 200 below the first field plate structure 132, and a vertical projection center of the first doped region 104 in a thickness direction of the substrate 10 coincides with a vertical projection center of the first field plate structure 132 in the thickness direction of the substrate 10.

In an actual preparation process, in the ion implantation process of forming the body region contact region 103, the ion implantation dose is relatively large. However, the first doped region 104 in the embodiment of the present disclosure generally requires a low doping concentration to effectively improve the withstand voltage level of the device.

Therefore, the first doped region 104 and the body region contact region 103 cannot generally be formed in a one-step ion implantation process. In the embodiment of the present disclosure, by disposing the first blocking structure, in the ion implantation process, a part of ions can pass through the first blocking structure and then be implanted into the second region 200, so that the body region contact region 103 and the first doped region 104 can be formed in the one-step ion implantation process, thereby simplifying the process, saving the photomask, and reducing the cost. A vertical projection center of the first doped region 104 that is formed by ion implantation using the first field plate structure 132 as the blocking structure in the thickness direction of the substrate 10 coincides with a vertical projection center of the first field plate structure 132 in the thickness direction of the substrate 10, so that a position of the formed first doped region 104 can be better controlled, thereby better playing the role of improving the withstand voltage level of the device.

In some embodiments, please refer to FIG. 14, the laterally diffused metal oxide semiconductor device further includes a first field plate structure 132 located above the first drift region 101. The first blocking structure may include a spacer structure 141, the spacer structure 141 is located between the first field plate structure 132 and the first gate structure 131 and extends from a sidewall of the first field plate structure 132 to a sidewall of the first gate structure 131. The first doped region 104 is located in a second region 200 below the spacer structure 141, and a vertical projection center of the first doped region 104 in a thickness direction of the substrate 10 coincides with a vertical projection center of the spacer structure 141 in the thickness direction of the substrate 10.

In the actual preparation process, the first doped region 104 can be formed by ion implantation using the spacer structure 141 as a blocking structure. In this case, the vertical projection center of the first doped region 104 in the thickness direction of the substrate 10 coincides with the vertical projection center of the spacer structure 141 in the thickness direction of the substrate 10, so that a position of the formed first doped region 104 can be better controlled, thereby better playing the role of improving the withstand voltage level of the device.

In some embodiments, please continue to refer to FIG. 14, the laterally diffused metal oxide semiconductor device may further include: a second spacer structure 142 and a third spacer structure 143, and the second spacer structure 142 and the third spacer structure 143 respectively cover the other sidewalls of the first field plate structure 132 and the first gate structure 131.

In some embodiments, please refer to FIG. 13 and FIG. 14, the laterally diffused metal oxide semiconductor device may also include: a first gate dielectric layer 11 at least located below the first gate structure 131; a first field oxide layer 12 at least located below the first field plate structure 132; a first drain region 105 located in the first drift region 101, where the first drain region 105 is located in the first drift region 101 on a side of the first field plate structure 132 away from the first gate structure 131; a first source region 106 located in the body region 102, where the first source region 106 is located between the first gate structure 131 and the body region contact region 103; a first drain 171, a first field plate contact 172, a first gate contact 173, a first source 174, and a body region contact 175 that are conductively connected to the first drain region 105, the first field plate structure 132, the first gate structure 131, the first source region 106, and the body region contact region 103, respectively.

In some embodiments, please refer to FIG. 15, the substrate 10 further includes a second drift region 201, and the second drift region 201 and the first drift region 101 are respectively located on two sides of the body region 102. The laterally diffused metal oxide semiconductor device further includes:

a second gate structure 231 located above a portion of the body region 102 and a portion of the second drift region 201, where the second drift region 201 further includes a third region 300 that is not covered by the second gate structure 231;

a second blocking structure located above the third region 300 of the second drift region 201, where the second blocking structure is located on a side of the second gate structure 231 away from the first gate structure 131; and a second doped region 204 of the second conductivity type located in the third region 300 of the second drift region 201, where a doping concentration of the second doped region 204 is lower than a doping concentration of the second drift region 201, and the second doped region 204, the first doped region 104, and the body region contact region 103 are formed in a one-step ion implantation process.

The role of the second doped region 204 in the embodiment of the present disclosure can be understood by referring to the role of the first doped region 104 in the aforementioned embodiment. Since the second doped region 204, the first doped region 104, and the body region contact region 103 can be formed in the one-step ion implantation process, the process is simple, and the cost can be saved.

In some embodiments, the second blocking structure may include a second field plate structure 232 as shown in FIG. 15. In this case, the second doped region 204 is located in the second drift region 201 below the second field plate structure 232. In some other embodiments of the present disclosure, the second blocking structure may include a fourth spacer structure 241 as shown in FIG. 15, and the fourth spacer structure 241 is located between the second gate structure 231 and the second field plate structure 232 and extends from the sidewall of the second gate structure 231 to the sidewall of the second field plate structure 232. It can be understood that, in this case, the second doped region 204 is located in the second drift region 201 below the fourth spacer structure 241.

In some embodiments, the laterally diffused metal oxide semiconductor device may further include: a sixth spacer structure 243 and a fifth spacer structure 242 respectively covering the other sidewalls of the second gate structure 231 and the second field plate structure 232, and a second drain region 205 located in the second drift region 201 on a side of the second field plate structure 232 away from the second gate structure 231.

As shown in FIG. 15, in the embodiment of the present disclosure, the finally formed device structure may include a first unit 1 and a second unit 2 with similar structures. The first unit 1 and the second unit 2 may share a first source region 106 and a body region contact region 103. The composition structure and role of each part in the first unit 1 may be understood with reference to the aforementioned embodiment. The composition structure and role of each part in the second unit 2 may be understood with reference to the composition structure and the role of a corresponding part in the first unit 1. For example, the first drift region 101 corresponds to the second drift region 201, the first gate structure 131 corresponds to the second gate structure 231, the first blocking structure corresponds to the second blocking structure, the first doped region 104 corresponds to the second doped region 204, and the first drain region 105 corresponds to the second drain region 205, etc.

It should be noted that the embodiments of the laterally diffused metal oxide semiconductor device provided in the present disclosure and the embodiments of the method for preparing the laterally diffused metal oxide semiconductor device belong to the same concept. In a case that there is no conflict, the technical features in the technical solution described in each of the embodiments can be arbitrarily combined. However, it should be further noted that the combination of the various technical features of the laterally diffused metal oxide semiconductor device provided in the embodiments of the present disclosure can solve the technical problem to be solved by the present disclosure. Therefore, the laterally diffused metal oxide semiconductor device provided in the embodiments of the present disclosure may not be limited by the method for preparing the laterally diffused metal oxide semiconductor device provided in the embodiments of the present disclosure, and any laterally diffused metal oxide semiconductor device prepared by any preparation method that can form the structure of the laterally diffused metal oxide semiconductor device provided in the embodiment of the present disclosure is within the scope of protection of the present disclosure.

It should be understood that the above embodiments are exemplary and are not intended to include all possible implementations included in the present disclosure. Various modifications and changes may also be made on the basis of the above embodiments without departing from the scope of the present disclosure. Similarly, the various technical features of the above embodiments may also be combined arbitrarily to form other embodiments of the present disclosure that may not be clearly described. Therefore, the above embodiments only express several implementations of the present disclosure and do not limit the scope of protection of the present disclosure.

The invention claimed is:

1. A method for preparing a laterally diffused metal oxide semiconductor device, the method comprising:

providing a substrate, wherein the substrate comprises a first drift region of a first conductivity type and a body region of a second conductivity type;

forming a first gate structure and a first blocking structure, wherein the first gate structure is formed above a portion of the body region and a portion of the first drift region, the body region comprises a first region not covered by the first gate structure, the first drift region comprises a second region not covered by the first gate structure, and the whole second region of the first drift region is below the first blocking structure;

wherein the method further comprises: performing an ion implantation process, wherein a part of ions are implanted into the first region of the body region to form a body region contact region of the second conductivity type, the first blocking structure comprises a first field plate structure, a part of ions are implanted into the whole second region of the first drift region after passing through the first blocking structure to form a first doped region of the second conductivity type, the first field plate is configured as a blocking structure during the ion implantation process to form the first doped region, and a concentration of ions implanted into the second region is lower than a concentration of ions implanted into the first region; or wherein the method further comprises:

forming the first field plate structure above the first drift region, wherein the first blocking structure comprises a spacer structure located between the first field plate structure and the first gate structure and extending from a sidewall of the first field plate structure to a sidewall of the first gate structure;

performing an ion implantation process, wherein a part of ions are implanted into the first region of the body region to form the body region contact region of the second conductivity type, a part of ions are implanted into the second region of the first drift region after passing through the spacer structure to form the first doped region of the second conductivity type, and a concentration of ions implanted into the second region is lower than a concentration of ions implanted into the first region, wherein the body region contact region is formed in a one-step ion implantation process together with the first doped region.

2. The method for preparing a laterally diffused metal oxide semiconductor device according to claim 1, wherein in a case that the first blocking structure comprises the first field plate structure, and the performing an ion implantation process comprises:

forming a first mask layer, wherein the first mask layer exposes a surface of the first field plate structure and a surface of the first region; and performing the ion implantation process using the first mask layer as a mask to form the first doped region and the body region contact region.

3. The method for preparing a laterally diffused metal oxide semiconductor device according to claim 1, wherein in a case that the first blocking structure comprises the spacer structure, the performing an ion implantation process comprises:

forming a second mask layer, wherein the second mask layer exposes a surface of the spacer structure and a surface of the first region; and performing the ion implantation process using the second mask layer as a mask to form the first doped region and the body region contact region.

4. The method for preparing a laterally diffused metal oxide semiconductor device according to claim 1, wherein a doping concentration of the first doped region is lower than a doping concentration of the first drift region.

5. The method for preparing a laterally diffused metal oxide semiconductor device according to claim 1, wherein the substrate comprises a second drift region, and the second drift region and the first drift region are respectively located on two sides of the body region, and the method further comprises:

forming a second gate structure and a second blocking structure, wherein the second gate structure is formed above a portion of the body region and a portion of the second drift region, the second drift region comprises a third region not covered by the second gate structure, the second blocking structure is formed above the third region of the second drift region, and the second blocking structure is located on a side of the second gate structure away from the first gate structure; and during the performing an ion implantation process, a part of the ions are implanted into the third region of the second drift region after passing through the second blocking structure to form a second doped region of the second conductivity type.

6. The method for preparing a laterally diffused metal oxide semiconductor device according to claim 2, wherein the substrate comprises a second drift region, and the second drift region and the first drift region are respectively located on two sides of the body region, and the method further comprises:

forming a second gate structure and a second blocking structure, wherein the second gate structure is formed above a portion of the body region and a portion of the second drift region, the second drift region comprises a third region not covered by the second gate structure, the second blocking structure is formed above the third region of the second drift region, and the second blocking structure is located on a side of the second gate structure away from the first gate structure; and during the performing an ion implantation process, a part of the ions are implanted into the third region of the second drift region after passing through the second blocking structure to form a second doped region of the second conductivity type.

7. The method for preparing a laterally diffused metal oxide semiconductor device according to claim 3, wherein the substrate comprises a second drift region, and the second drift region and the first drift region are respectively located on two sides of the body region, and the method further comprises:

forming a second gate structure and a second blocking structure, wherein the second gate structure is formed above a portion of the body region and a portion of the second drift region, the second drift region comprises a third region not covered by the second gate structure, the second blocking structure is formed above the third region of the second drift region, and the second blocking structure is located on a side of the second gate structure away from the first gate structure; and during the performing an ion implantation process, a part of the ions are implanted into the third region of the second drift region after passing through the second blocking structure to form a second doped region of the second conductivity type.

8. The method for preparing a laterally diffused metal oxide semiconductor device according to claim 4, wherein the substrate comprises a second drift region, and the second drift region and the first drift region are respectively located on two sides of the body region, and the method further comprises:

forming a second gate structure and a second blocking structure, wherein the second gate structure is formed above a portion of the body region and a portion of the second drift region, the second drift region comprises a third region not covered by the second gate structure, the second blocking structure is formed above the third region of the second drift region, and the second blocking structure is located on a side of the second gate structure away from the first gate structure; and during the performing an ion implantation process, a part of the ions are implanted into the third region of the second drift region after passing through the second blocking structure to form a second doped region of the second conductivity type.

9. A laterally diffused metal oxide semiconductor device, comprising:

a substrate;

a first drift region of a first conductivity type and a body region of a second conductivity type, located in the substrate, respectively;

a first gate structure located above a portion of the body region and a portion of the first drift region, wherein the body region comprises a first region not covered by the first gate structure, the first drift region comprises a second region not covered by the first gate structure, and the whole second region of the first drift region is below the first blocking structure, a body region contact region of the second conductivity type located in the first region of the body region; and a first doped region of the second conductivity type located in the second region of the first drift region, and a doping concentration of the first doped region is lower than a doping concentration of the first drift region, wherein the body region contact region and the first doped region are formed in a one-step ion implantation process, during the ion implantation process, a part of ions are implanted into the first region of the body region to form the body region contact region of the second conductivity type, a part of ions are implanted into the whole second region after passing through the first blocking structure to form the first doped region, the first field plate is configured as a blocking structure during the one-step ion implantation process to form the first doped region;

wherein the first blocking structure comprises a first field plate structure, the first doped region locates in the second region below the first field plate structure, and a vertical projection center of the first doped region in a thickness direction of the substrate coincides with a vertical projection center of the first field plate structure in the thickness direction of the substrate; or wherein the laterally diffused metal oxide semiconductor device comprises the first field plate structure located above the first drift region, the first blocking structure comprises a spacer structure located between the first field plate structure and the first gate structure and extending from a sidewall of the first field plate structure to a sidewall of the first gate structure, the first doped region is located in the second region below the spacer structure, and the vertical projection center of the first doped region in the thickness direction of the substrate coincides with the vertical projection center of the spacer structure in the thickness direction of the substrate.

10. The laterally diffused metal oxide semiconductor device according to claim 9, wherein the substrate further comprises a second drift region, and the second drift region and the first drift region are respectively located on two sides of the body region; and the laterally diffused metal oxide semiconductor device further comprises:

a second gate structure located above a portion of the body region and a portion of the second drift region, and the second drift region comprises a third region not covered by the second gate structure;

a second blocking structure located above the third region of the second drift region, and the second blocking structure is located on a side of the second gate structure away from the first gate structure; and a second doped region of the second conductivity type located in the third region of the second drift region, a doping concentration of the second doped region is lower than a doping concentration of the second drift region, and the second doped region is formed in a one-step ion implantation process together with the first doped region and the body region contact region.

* * * * *